United States Patent
Ho et al.

(10) Patent No.: US 10,163,754 B2
(45) Date of Patent: Dec. 25, 2018

(54) LID DESIGN FOR HEAT DISSIPATION ENHANCEMENT OF DIE PACKAGE

(71) Applicant: Taiwan Semiconductor Manufacturing Company, Ltd., Hsin-Chu (TW)

(72) Inventors: Kuan-Lin Ho, Hsin-Chu (TW); Sheng-Hsiang Chiu, Tainan (TW); Hsin-Yu Pan, Taipei (TW); Yu-Chih Liu, Taipei (TW); Chin-Liang Chen, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 3 days.

(21) Appl. No.: 14/140,692

(22) Filed: Dec. 26, 2013

(65) Prior Publication Data
US 2015/0187679 A1 Jul. 2, 2015

(51) Int. Cl.
| | |
|---|---|
| *H01L 23/34* | (2006.01) |
| *H01L 23/055* | (2006.01) |
| *H01L 23/367* | (2006.01) |
| *H01L 23/433* | (2006.01) |
| *H01L 23/04* | (2006.01) |
| *H01L 21/48* | (2006.01) |
| *H01L 21/56* | (2006.01) |
| *H01L 23/00* | (2006.01) |

(Continued)

(52) U.S. Cl.
CPC ........ *H01L 23/433* (2013.01); *H01L 21/4803* (2013.01); *H01L 21/563* (2013.01); *H01L 23/04* (2013.01); *H01L 23/055* (2013.01); *H01L 23/34* (2013.01); *H01L 23/367* (2013.01); *H01L 23/3675* (2013.01); *H01L 23/562* (2013.01); *H01L 25/0655* (2013.01); *H01L 25/0657* (2013.01); *H01L 23/3737* (2013.01); *H01L 2224/16145* (2013.01); *H01L 2224/16225* (2013.01); *H01L 2224/32225* (2013.01); *H01L 2224/73204* (2013.01); *H01L 2224/73253* (2013.01); *H01L 2224/83385* (2013.01); *H01L 2225/06513* (2013.01); *H01L 2225/06517* (2013.01); *H01L 2225/06565* (2013.01); *H01L 2225/06589* (2013.01); *H01L 2924/0002* (2013.01); *H01L 2924/15311* (2013.01)

(58) Field of Classification Search
CPC ...... H01L 23/055; H01L 23/367; H01L 23/34
USPC ........... 257/690, 712, 713, E23.08, E23.102, 257/E23.104
See application file for complete search history.

(56) References Cited

U.S. PATENT DOCUMENTS 5,098,609 A * 3/1992 Iruvanti et al. ................ 252/511
5,136,469 A * 8/1992 Carusillo ........... A61B 17/1628
361/720

(Continued)

*Primary Examiner* — Robert T Huber
(74) *Attorney, Agent, or Firm* — Slater Matsil, LLP (57) ABSTRACT

Embodiments of a lid covering a device die improving heat dissipation for a die package are described. Trenches are formed on the bottom side of a lid to increase surface area for heat dissipation. Various embodiments of the trenches on the lid are described. The layout and design of the trenches could be optimized to meet the heat dissipation need of the device die(s). By using the lid with trenches, heat dissipation efficiency is improved and the amount of thermal interface material (TIM) could be reduced. In addition, the selection of thermal interface materials for the lid is widened.

20 Claims, 10 Drawing Sheets

(51) Int. Cl.
  *H01L 25/065* (2006.01)
  *H01L 23/373* (2006.01)

(56) References Cited

U.S. PATENT DOCUMENTS

| | | | |
|---|---|---|---|
| 5,825,084 A | | 10/1998 | Lau et al. |
| 5,825,087 A | * | 10/1998 | Iruvanti et al. ............... 257/707 |
| 5,931,222 A | * | 8/1999 | Toy ........................... F28F 3/02 |
| | | | 165/185 |
| 6,046,077 A | * | 4/2000 | Baba ..................... H01L 21/563 |
| | | | 257/E21.503 |
| 6,400,014 B1 | * | 6/2002 | Huang ................. H01L 23/4334 |
| | | | 257/706 |
| 6,515,360 B2 | | 2/2003 | Matsushima et al. |
| 6,724,080 B1 | | 4/2004 | Ooi et al. |
| 6,891,259 B2 | * | 5/2005 | Im ........................... H01L 23/16 |
| | | | 257/687 |
| 7,025,848 B2 | * | 4/2006 | Wang .................. H01L 21/4882 |
| | | | 156/256 |
| 7,728,440 B2 | * | 6/2010 | Honda ........................... 257/778 |
| 8,077,466 B2 | * | 12/2011 | Mizunashi .......... H01L 21/4878 |
| | | | 165/185 |
| 2003/0085475 A1 | | 5/2003 | Im et al. |
| 2006/0270106 A1 | | 11/2006 | Chiu et al. |
| 2008/0296757 A1 | | 12/2008 | Hoffman et al. |
| 2010/0019379 A1 | | 1/2010 | Zhao et al. |
| 2010/0246133 A1 | | 9/2010 | Schmidt et al. |
| 2011/0156235 A1 | * | 6/2011 | Yuan ....................... H01L 23/16 |
| | | | 257/690 |
| 2013/0093075 A1 | | 4/2013 | Liu et al. |
| 2013/0322023 A1 | * | 12/2013 | Kim .................... H01L 23/4334 |
| | | | 361/720 |

* cited by examiner

LID DESIGN FOR HEAT DISSIPATION ENHANCEMENT OF DIE PACKAGE

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components by continual reductions in minimum feature size, which allow more components to be integrated into a given area. These smaller electronic components also require smaller packages that utilize less area and/or lower height than packages of the past, in some applications.

As a result, new packaging technologies have begun to be developed. By adopting the new packaging technologies, the integration levels of the packages may be increased. These relatively new types of packaging technologies for semiconductors face manufacturing challenges.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

This description of the various embodiments is intended to be read in connection with the accompanying drawings, which are to be considered part of the entire written description. In the description, relative terms such as "before," "after," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the system be constructed or operated in a particular orientation. Terms concerning attachments, coupling and the like, such as "connected" and "interconnected," refer to a relationship wherein components are attached to one another either directly or indirectly through intervening components, unless expressly described otherwise.

Figure 1A:
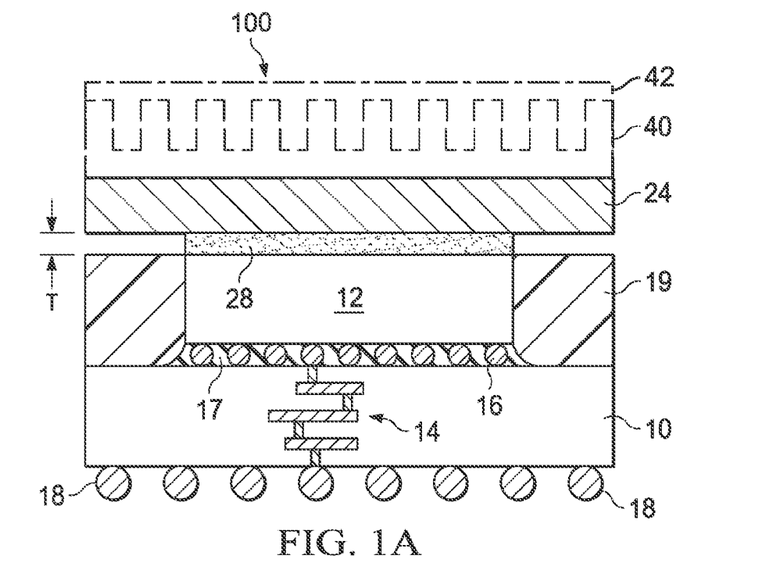
FIG. 1A illustrates a cross-sectional view of a package structure, in accordance with some embodiments.

Package lids and heat sinks are used in integrated circuit assemblies to provide mechanism of heat dissipation. FIG. 1A illustrates a cross-sectional view of package structure 100 in accordance with some embodiments. Package structure 100 includes package component 12 bonded to a top surface of package component 10, in accordance with some embodiments. Package component 10 is a semiconductor substrate in some embodiments. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. Package component 10 could include active and/or passive elements. Package component 10 may include through substrate vias (TSVs) and function as an interposer, in accordance with some embodiments.

In some embodiments, package component 10 is a package substrate (and hence is alternatively referred to as package substrate 10 hereinafter). The package substrate may be made of bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals. In some embodiments, the package substrate is a multiple-layer circuit board. In the following discussed exemplary embodiments, package component 10 is referred to as package substrate 10.

Metal interconnect 14, which includes metal lines and vias, is formed in package component 10 and electrically connects metal bumps 16 on one side of package component 10 to metal bumps 18 on the opposite side of package component 10. Metal bumps 18 may also be ball grid array (BGA) balls, and may be used to bond package component 10 to a printed circuit board (PCB, not shown), for example.

Package component 12 is a device die including active devices (not shown) formed therein, in accordance with some embodiments. In the following discussed exemplary embodiments, package component 12 is also referred to as device die 12.

As shown in FIG. 1A, device die 12 is bonded to package substrate 10 by metal bumps 16. In some embodiments, an underfill 17 is applied to fill the space between device die 12 and package substrate 10. The underfill 17 provides support for the metal bumps. A molding compound 19 is applied to surround device die 12, in accordance with some embodiments.

FIG. 1A also shows a lid 24 being placed over, and bonded to, device die 12. Lid 24 may have a flat top surface. Lid 24 may be formed of a homogeneous material throughout, which means all parts of lid 24 are formed of the same material. In an embodiment, lid 24 is a metal lid. For example, lid 24 may be made of copper (Cu) with a thin layer of nickel (Ni), although other metals or metal alloys such as aluminum or aluminum alloys may also be used. A thermal interface material (TIM) 28 is used to join lid 24 and package component 12. TIM 28 has a high thermal conductivity and adheres to both package component 12 and lid 24. In some embodiments, TIM 28 is made of silicones, which are polymers including silicon, carbon, hydrogen, oxygen and sometimes other elements. Alternatively, TIM 28 may also be made of other materials, such as alumina ($Al_2O_3$) or zinc oxide ($ZnO_2$) mixed with silicone ($[R_2SiO]n$) and other applicable materials. In some embodiments, the thickness T of TIM 28 is in a range from about 10 μm to about 300 μm. Accordingly, the heat generated in device die 12 may dissipate to metal lid 24, and then dissipate to the external environment. Certain types of device dies 12 generate a large amount of heat during operation. For example device dies that include central processing unit (CPU), graphical processing unit (GPU), and/or field-programmable gate array (FPGA) tend to generate large amount of heat. In some embodiments device die 12 is a top die of a three-dimensional integrated circuit (3DIC).

There may be other devices bonded to package substrate 10. For example, additional devices, such as passive devices including capacitors, baluns, devices dies, and the like, may also be bonded to package substrate 10.

Optionally, a heat sink 40 (shown by dotted line) is bonded to metal lid 24 through TIM 42, in some embodiments. Heat sink 40 is made of a conductive material and has large surface area to help heat dissipation. Alternatively, a fanning device 42 (shown by dashed line), such as a fan, is bonded to metal lid 24, instead of heat sink 40. Similar to heat sink 40, the fanning device 42 also helps dissipation of heat generated by the device die 12.

Figure 1B:
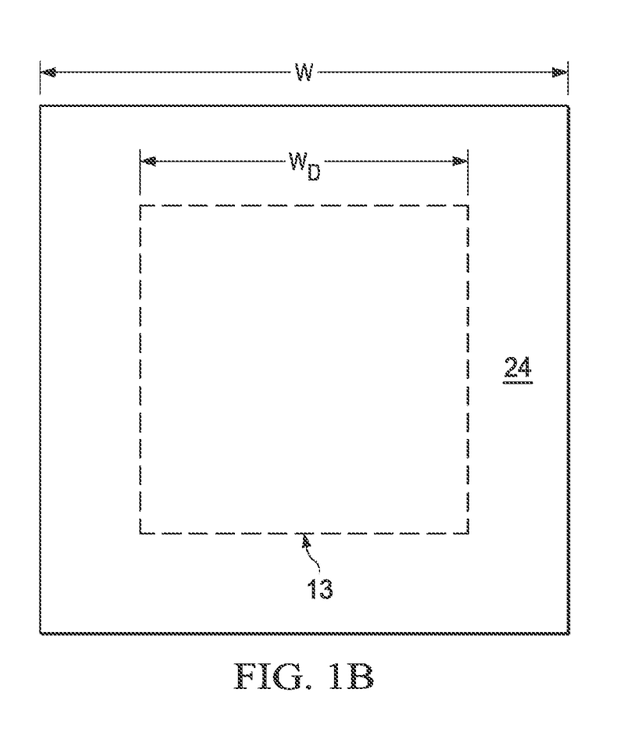
FIG. 1B illustrates a bottom view of a lid of the package structure of FIG. 1A, in accordance with some embodiments.

FIG. 1B shows a bottom view of lid 24 in accordance with some embodiments. FIG. 1B shows that lid 24 has a solid bottom surface. The boundary 13 of device die 12 is illustrated by dotted line to show that the surface area of device die 12 is smaller than the neighboring surface of lid 24. Both lid 24 and device die 12 have square-shape cross-section views in FIG. 1B. However, they can have rectangular-shape cross-sectional views. In some embodiments, the width W of lid 24 is in a range from about 5 mm to about 60 mm. In some embodiments, the width $W_D$ of device die 12 is in a range from about 2 mm to about 40 mm.

For advanced devices, the number of devices in a given area continues to increase. As a result, more heat is generated in a given area to be dissipated. Therefore, mechanisms to increase heat dissipation efficiency are desirable and beneficial to current and future semiconductor manufacturing technologies.

Figure 2A:
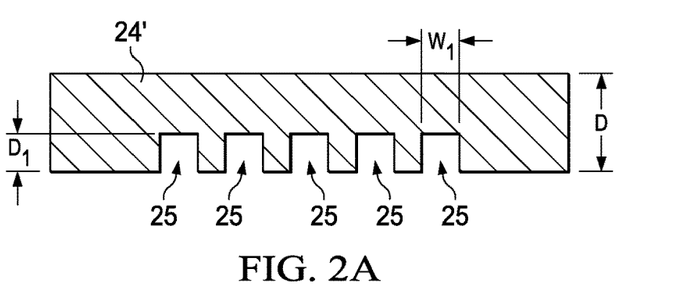
FIG. 2A illustrates a cross-sectional view of a lid of a package structure, in accordance with some embodiments.

FIG. 2A shows a cross-sectional view of lid 24', in accordance with some embodiments. FIG. 2A shows that lid 24' has a number of trenches 25. Trenches 25 are rectangular and formed to increase contact surface area between TIM 28 and lid 24', which increases heat dissipation efficiency. Lid 24' has a thickness D in a range from about 0.1 mm to about 5 mm. Each of trenches 25 has a width $W_1$ in a range from about 0.1 mm to about 40 mm and a depth $D_1$ in a range from about 0.05 mm to about 2.5 mm, in accordance with some embodiments. In some embodiments, a ratio of $D_1$ to D is equal to or less than about 0.5.

Figure 2B:
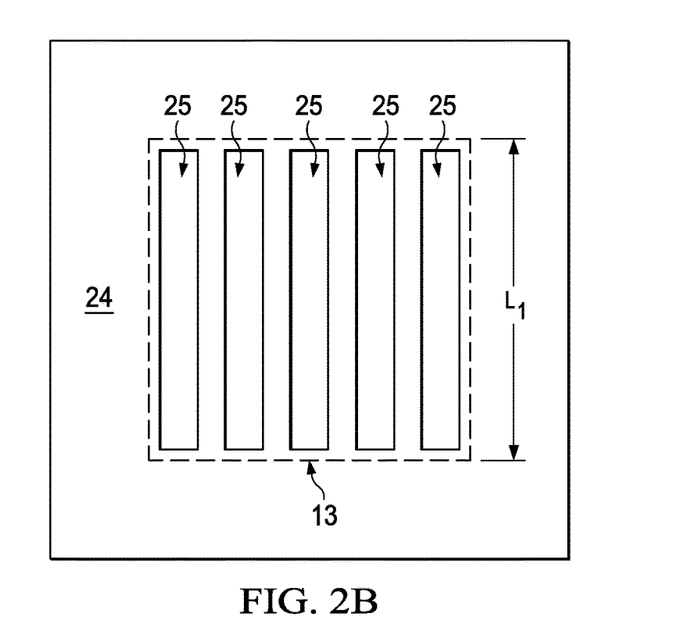
FIG. 2B shows a bottom view of the lid of FIG. 2A, in accordance with some embodiments.

FIG. 2B shows a bottom view of lid 24', in accordance with some embodiments. FIG. 2B shows the trenches 25 of FIG. 2A spanning almost the entire width of device die 12. Trenches 25 fit inside the boundary 13 of device die. Each of trenches 25 has a length $L_1$ in a range from about 2 mm to about 40 mm, in accordance with some embodiments.

Figure 2C:
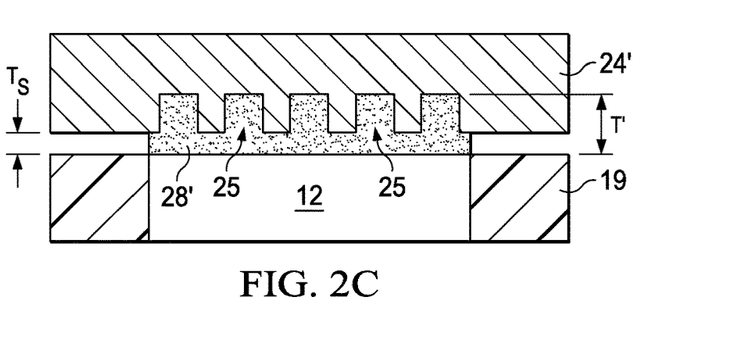
FIG. 2C shows a cross-sectional view of a lid 24' a device die via a thermal interface material (TIM), in accordance with some embodiments.

FIG. 2C shows a cross-sectional view of lid 24' adhered to device die 12 via TIM 28', in accordance with some embodiments. TIM 28' fills the trenches 25 of lid 24'. The thickness T' of TIM 28' including the trench portion is higher than the thickness $T_S$ not including the trench portion. In some embodiments, T' is equal to T of FIG. 1A. However, T' can be different from T. $T_S$ is less than T. To prevent direct contact between lid 24' and device die 12, $T_S$ has a minimal value. In some embodiments, $T_S$ is in a range from about 10 μm to about 300 μm.

As mentioned above, trenches 25 are formed to increase contact surface area between TIM 28' and lid 24' and to increase heat dissipation efficiency. Absolute thermal resistance $R_{th}$ measures the thermal resistance of a component, such as TIM 28'. Absolute thermal resistance $R_{th}$ is a function of thickness ($T_h$), the heat conduction surface area (A), and thermal conductivity (K) of the component, such as TIM 28'. Equation (1) illustrates the relationship of these factors with $R_{th}$.

$$R_{th} = T_h/(AK) \qquad (1)$$

$R_{th}$ value can be calculated for TIM 28'. By forming trenches 25 in lid 24', the heat conduction surface area (A), or the contact surface between TIM 28' and lid 24', of the TIM 28' is greatly increased. As a result $R_{th}$ of TIM 28' is reduced. In addition, the reduced thickness $T_S$ ($T_S$<T) between the bottom surface of lid 24' and contacting surface of device die 12, also contributes to the reduction of $R_{th}$. If absolute thermal resistance Rth of TIM 28' is reduced, the heat conduction efficiency (or heat dissipation efficiency) of TIM 28' is increased. The heat conduction efficiency (or heat dissipation efficiency) of TIM 28' is equivalent to heat conduction efficiency of lid 24', since the heat is transferred from device die 12 to lid 24' via TIM 28'. Therefore, forming trenches in lid 24' could improve heat dissipation efficiency.

Calculation of the contact surface area of TIM 28' indicates an increase in $R_{th}$ by 11.1% in comparison to TIM 28 of FIG. 1A when each of trench 25 of lid 24' has a width $W_1$ of 1 mm and depth $D_1$ of 100 μm, in accordance with some embodiments. The contact surface area for TIM 28 (without trenches) is 400 mm² with the width of the square-shaped device die 12 being 20 mm. Trenches 25 span across the entire width of device die 12. The contact surface area of lid 24' directly above device die 12 (also the contact area for TIM 28') is 442 mm². The increase in contact surface area, which is surface area A in equation (1), contributes to reduction of $R_{th}$ of TIM 28'.

If the thickness T' of TIM 28' including the trench portion is equal to T of TIM 28 of FIG. 1A, the amount of TIM used would be reduced due to trenches 25. For example, if T (or TIM 28) is 150 μm and the surface area of device die 12 is 400 mm², the volume of TIM 28 is 60 mm³. In contrast, the volume of TIM 28' is 40 mm³, if each of trench 25 of lid 24' has a width $W_1$ of 1 mm and depth $D_1$ of 100 μm and if T' is equal to T (150 μm). High quality TIM with good conductivity is expensive. Having trenches in lid 24' reduces the usage amount of TIM 28' and saves cost.

Heat dissipation simulation of TIM 28' (T'=150 μm) with device die 12 and lid 24' with trenches 25 described above (W1=1 mm and D1=100 μm) shows $R_{th}$ is about 0.056 K/W. In contrast, Rth for the corresponding TIM 28 (T=150 mm and without trenches) is about 0.094 K/W. The TIM material used in this simulation has a thermal conductivity (K) of 4 W/mK. The $R_{th}$ values show a drastic reduction of about 40% by using lid 24' with trenches 25. Reduced absolute thermal resistance $R_{th}$ increases the heat dissipation efficiency. The price of TIM correlates with the quality and thermal conductivity of the material. TIMs with higher quality and better thermal conductivities usually cost more. By using a lid with increased contact surface area, such as lid 24', TIM with lower thermal conductivity may be used to save cost and still achieves the target heat dissipation requirement. As a result, the selection of thermal interface materials for a lid with trenches is broadened.

Figure 3A:
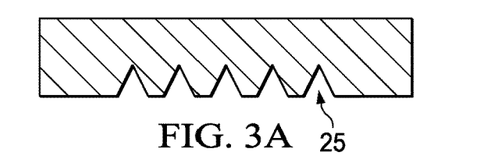
FIGS. 3A-3G show cross-sectional views of trenches of a lid, in accordance with various embodiments.
Figure 3B:
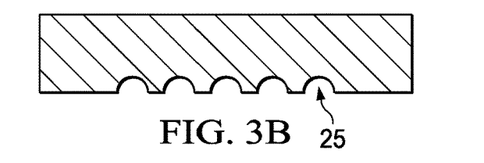
Figure 3C:
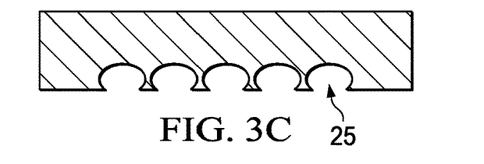
Figure 3D:
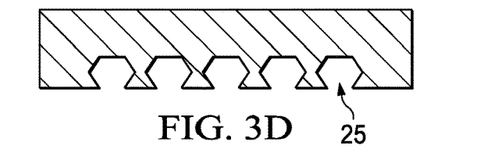
Figure 3E:
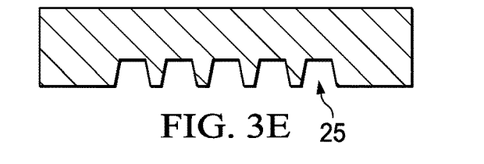
Figure 3F:
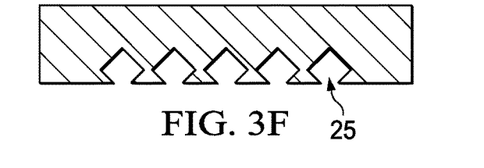
Figure 3G:
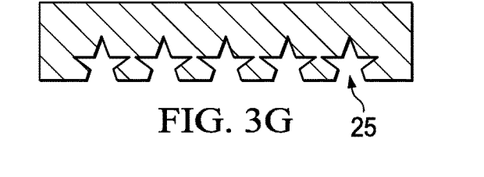

FIG. 2A shows an embodiment of a cross-section view of lid 24' with trenches 25. However, trenches 25 of lid 24' do not need to be rectangular and can have other shapes. FIGS. 3A-3G show cross-sectional views of trenches 25 of lid 24' in accordance with some embodiments. Each trench 25 on lid 24' in FIG. 3A has a triangular shape in cross-sectional view. The trenches 25 on lid 24' in FIG. 3B are shaped in half circles. The trenches 25 on lid 24' in FIG. 3C are shaped in partial ovals (or open ovals). The trenches 25 on lid 24' in FIG. 3D are shaped in partial hexagons (or open hexagons). The trenches 25 on lid 24' in FIG. 3E have wider widths near openings than bottoms and with linear surface profiles. The trenches 25 on lid 24' in FIG. 3F are shaped in partial diamonds (or open diamonds). The trenches 25 on lid 24' in FIG. 3G are shaped in partial starts (or open stars). Trenches 25 may have different cross-sectional views to increase the contact surface area. However, trenches 25 need to be shaped to allow TIM 28' to easily fill them. One skilled in the art can select a particular shape, or shapes, depending upon the application and design requirements. While all the trenches for a given embodiment are shown as the same, embodiments are contemplated in which different shaped trenches may be employed at different regions of the same lid 24'.

Figure 4A:
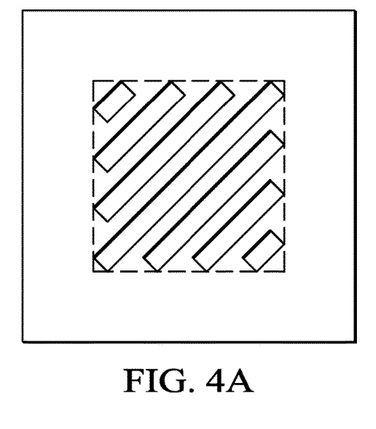
FIGS. 4A-4M show bottom views of trenches of a lid in accordance with various embodiments.
Figure 4B:
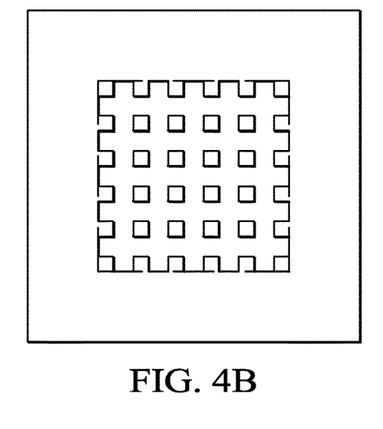
Figure 4C:
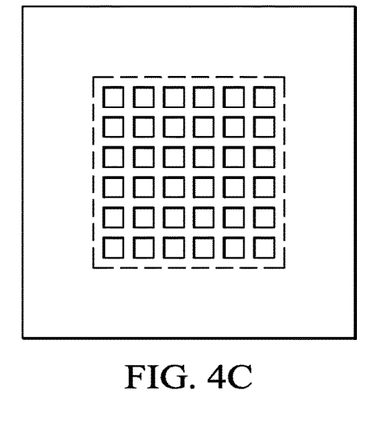
Figure 4D:
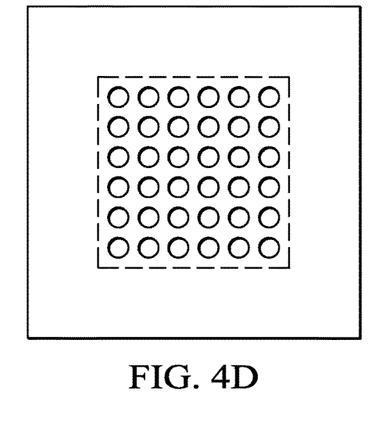
Figure 4E:
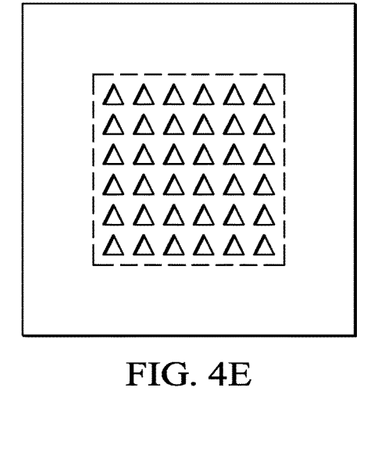
Figure 4F:
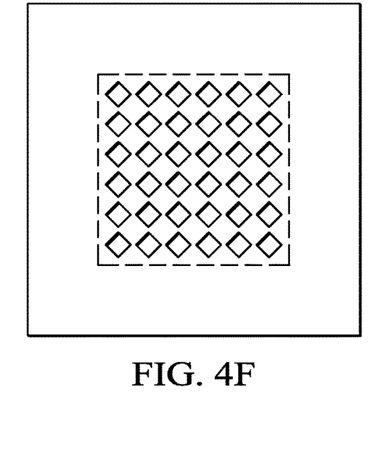
Figure 4G:
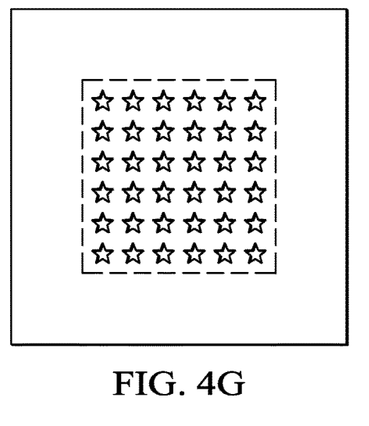

FIG. 2B shows an embodiment of a bottom view of lid 24' with trenches 25. Trenches 25 are shaped in long and parallel bars in FIG. 2B. However, trenches 25 may be shaped and arranged in various configurations. FIGS. 4A-4M show bottom views of trenches 25 of lid 24' in accordance with some embodiments. Trenches 25 on lid 24' in FIG. 4A are still shaped in long and parallel bars as in FIG. 2B. However, trenches 25 are oriented to run diagonally across device die 12, whose boundary 13 is marked by dotted line. Trenches 25 in FIG. 4B are intersecting bars and there are islands 15 of material of lid 24' at the intersections of trenches 25. Alternatively, trenches 25 could be repeating rectangles in bottom view, as shown in FIG. 4C. The rectangles in FIG. 4C are aligned in rows and columns. However, the rectangles can be arranged differently. Trenches 25 could be repeating circles in bottom view, as shown in FIG. 4D. The circles in FIG. 4D are aligned in rows and columns. However, the circles can be arranged differently. Trenches 25 could also be repeating triangles, diamonds, or stars in bottom views, as shown in FIGS. 4E, 4F, and 4G respectively. Different designs offer different contact surface areas. Designs should be chosen based on need.

Figure 4H:
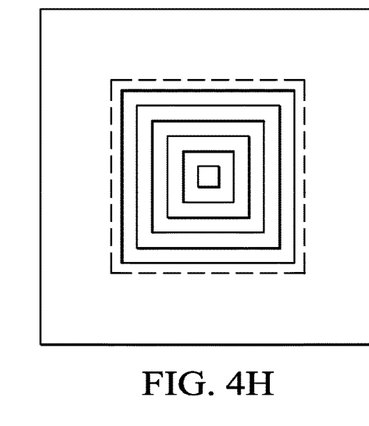
Figure 4I:
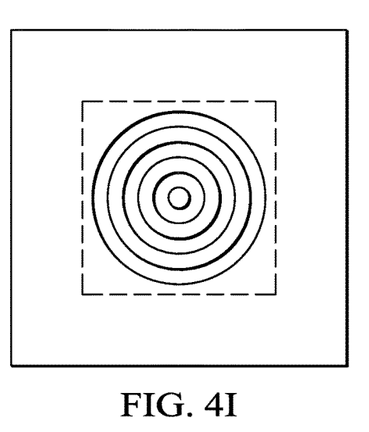
Figure 4J:
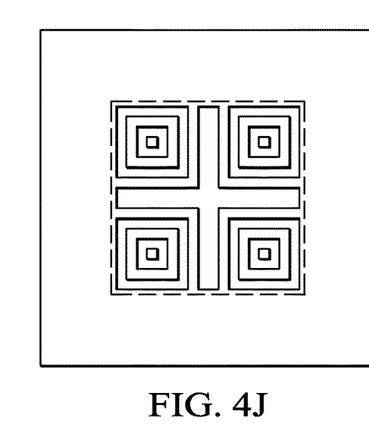
Figure 4K:
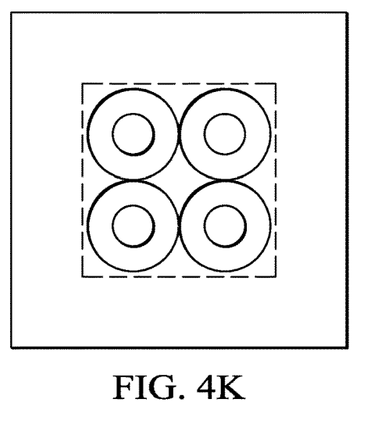

In addition, trenches 25 could be concentric, as shown in FIGS. 4H and 4I. FIG. 4H shows that each of trenches 25 is shaped in rectangular shape in bottom view. FIG. 4I shows that each of trenches 25 is shaped in circular shape in bottom view. The trenches are formed as close to the boundary 13 of device die 12 as possible to maximize the contact surface area. Trenches 25 may also have patterns, as shown in FIGS. 4J and 4K. They can be designed to meet the need of heat dissipation of device die 12. For example, the design of trenches 25 in FIGS. 4J and 4K could match or correlate to the circuit patterns or heat generation patterns of device die 12 in different embodiments.

Figure 4L:
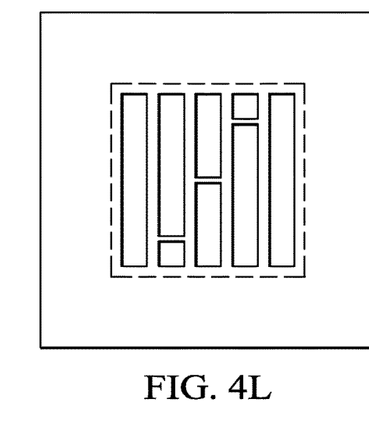
Figure 4M:
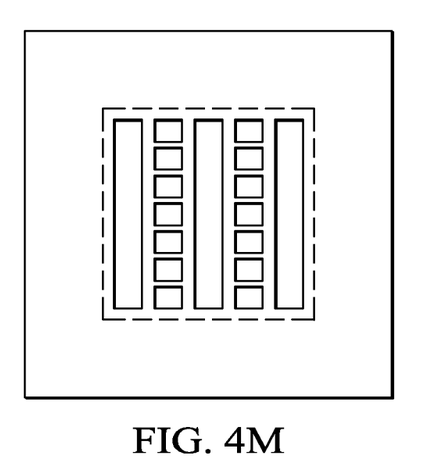

FIGS. 4L and 4M shows two additional patterns of trenches 25. FIG. 4L shows that some bar-shaped trenches 25 are not continuous and have a layer(s) of lid 24 material between trenches 25. FIG. 4M shows that different patterns of trenches 25 can be mixed together. In FIG. 4M, long bars of trenches 25 are mixed with trenches with rectangular bottom view. In some embodiments, different trenches and designs can be mixed together to match the thermal resistance characteristics of TIM 28' and lid 24' to chip 12, e.g., by matching trench design and pattern to hot spot regions on chip 12.

As described above, trenches 25 increase contact surface between lid 24' and TIM 28'. Different designs and patterns of trenches 25 would increase different amount of contact surface areas. In some embodiments, the increase of contact surface area between lid 24' directly over device die 12 (or between lid 24' and TIM 28') over a flat surface is in a range from about 2% to about 100%.

Figure 5A:
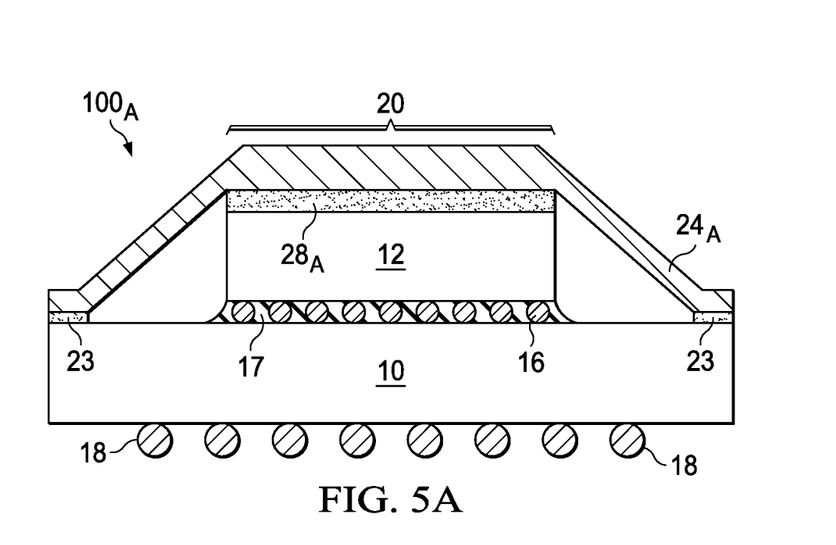
FIGS. 5A-5D illustrate cross-sectional views of package structures, in accordance with some embodiments.

The package structure 100 of FIG. 1A show lid 24 as a rectangular piece placed over device die 12, in some embodiments. However, there are different embodiments of structures for lid 24 and package structure 100. FIG. 5A shows a lid $24_A$ over device die 12, which is bonded to package substrate 10 via metal bumps 16 to form package structure $100_A$. Underfill 17 optionally fills the space between device die 12 and package substrate 10 to protect and support metal bumps 16. Lid $24_A$ adheres to device die 12 via TIM $28_A$ and also adheres to surfaces at the edges of package substrate via an adhesive layer 23. Device die 12 is covered by lid $24_A$ and is contained within the space between lid $24_A$ and package substrate 10. Lid $24_A$ has a flat portion 20 directly over device die 12. The flat portion 20 of lid $24_A$ is similar to lid 24' of FIGS. 2A and 2B. The various lid designs with trenches 25 described above of lid 24' may also be used for flat portion 20 of lid $24_A$.

Figure 5B:
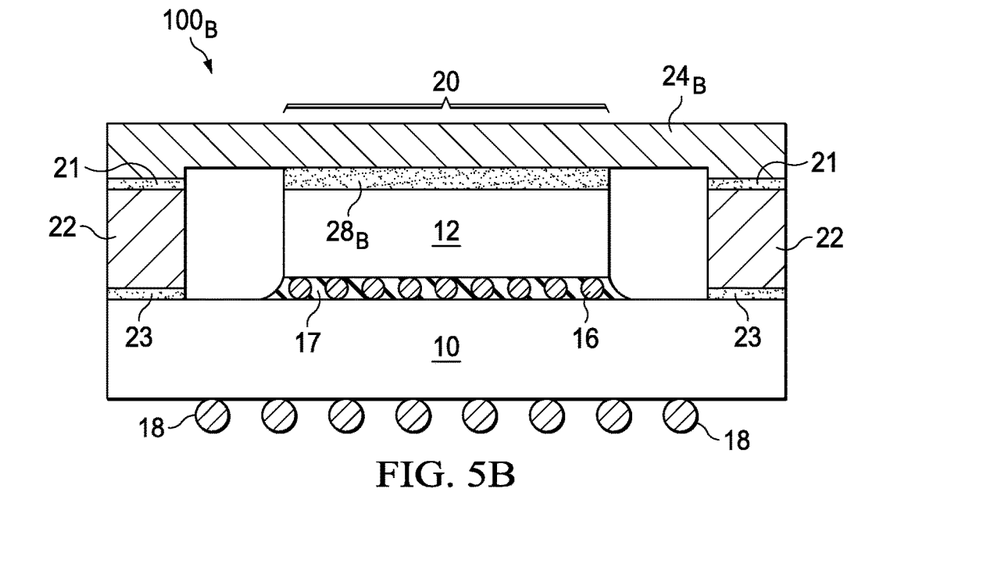

FIG. 5B shows a lid $24_B$ over device die 12, which is bonded to package substrate 10 via metal bumps 16 to form package structure $100_B$, in accordance with some embodiments. Underfill 17 fills the space between device die 12 and package substrate 10 to protect and support metal bumps 16. Lid $24_B$ adheres to device die 12 via TIM $28_B$ and also adheres to stiffener ring 22, placed at the edges between lid $24_B$ and package substrate 10, via adhesive layer 21 to form package structure $100_B$. Stiffener ring 22 supports lid $24_B$ and help form the space between lid $24_B$ and package substrate 10 to house device 12. Stiffener ring 22 adheres to surface of package substrate 10 via adhesive layer 23. Adhesive layers 21 and 23 are made of silicone, in some embodiments. Stiffener ring 22 is made of copper with nickel coating or aluminum alloys, in some embodiments. Lid $24_B$ has a flat portion 20 directly over device die 12. The flat portion 20 of lid $24_B$ is similar to lid 24' of FIGS. 2A and 2B. The various lid designs with trenches 25 described above of lid 24' may also be used for flat portion 20 of lid $24_B$.

Figure 5C:
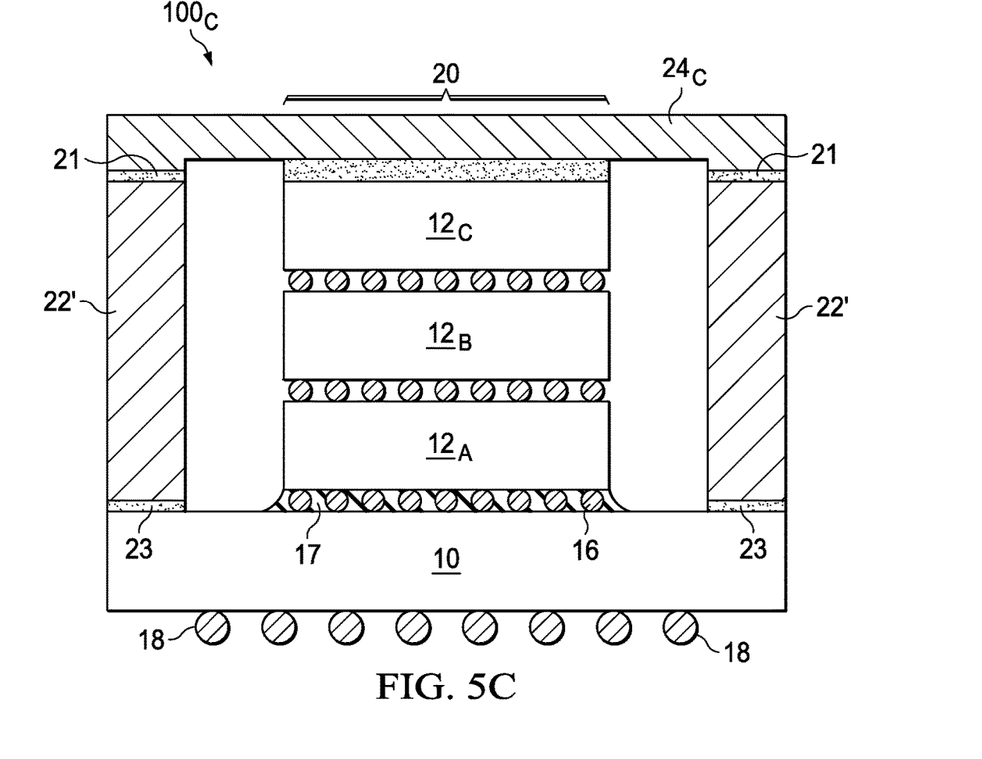

FIG. 5C shows a lid $24_C$ over device die stack 30, which is bonded to package substrate 10 via metal bumps 16 to form package structure $100_C$, in accordance with some embodiments. Device die stack 30 includes device dies $12_A$, $12_B$, and $12_C$, which are stacked on top of each other and are bonded to each other, as shown in FIG. 5C. Device dies $12_A$, $12_B$, and $12_C$ could be similar or different. Underfill 17 optionally fills the space between device die $12_A$ and package substrate 10 to protect and support metal bumps 16. Underfill(s) (not shown) similar to underfill 17 could fill the space between dies $12_A$ an, d $12_B$, and between dies $12_B$ and $12_C$. Lid $24_C$ adheres to top device die $12_C$ via TIM $28_C$ and also adheres to stiffener ring 22', placed at the edges between lid $24_C$ and package substrate 10 via adhesive layer 21. Stiffener ring 22' supports lid $24_C$ and help form the space between lid $24_C$ and package substrate 10 to house device stack 30. Stiffener ring 22' adheres to surface of package substrate 10 via adhesive layer 23. Adhesive layers 21 and 23 are made of silicone, in some embodiments. Stiffener ring 22 is made of copper with nickel coating or aluminum alloys, in some embodiments. Lid $24_C$ has a flat portion 20 directly over top device die $12_C$ of device die stack 30. The flat portion 20 of lid $24_C$ is similar to lid 24' of FIGS. 2A and 2B. The various lid designs with trenches 25 described above of lid 24' may also be used for flat portion 20 of lid $24_C$.

Figure 5D:
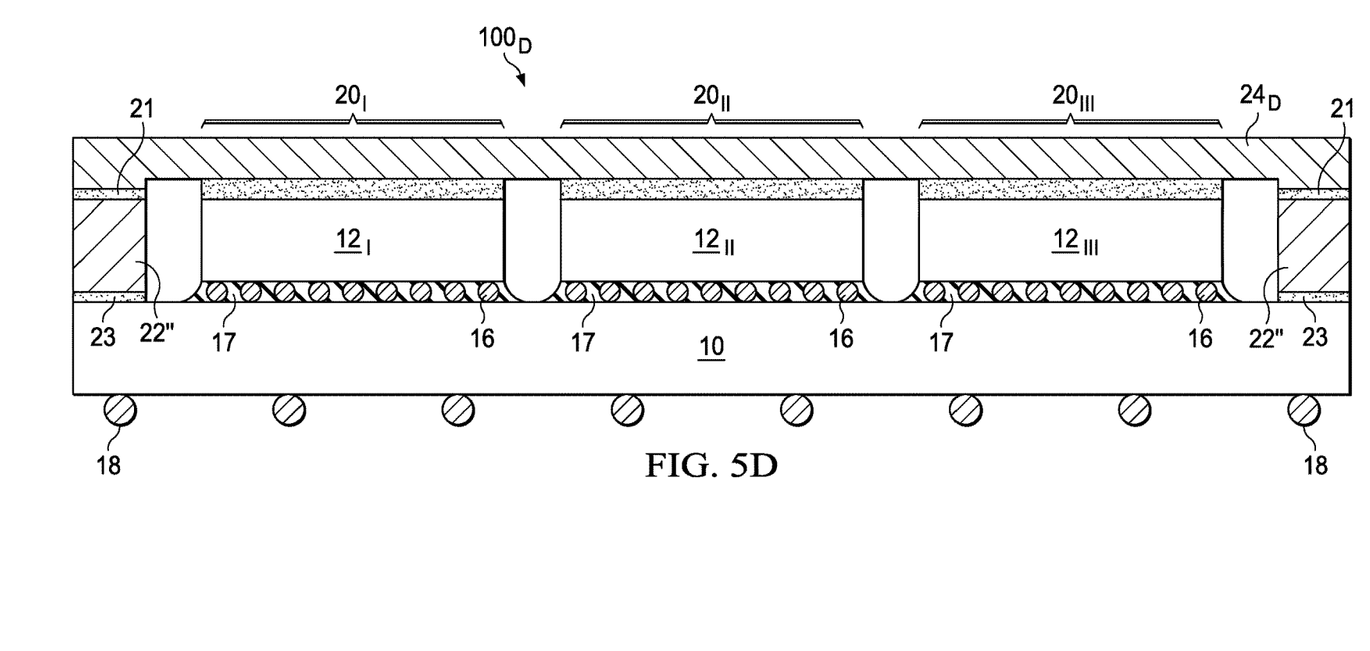

FIG. 5D shows a lid $24_D$ over device dies $12_I$, $12_{II}$, and $12_{III}$, which are bonded to package substrate 10 via metal bumps 16 to form package structure $100_D$, in accordance with some embodiments. Device dies $12_I$, $12_{II}$, and $12_{III}$ are placed side by side, as shown in FIG. 5C. Device dies $12_I$, $12_{II}$, and $12_{III}$ could be similar or different. Underfill optionally 17 fills the space between device dies $12_I$, $12_{II}$, and $12_{III}$ and package substrate 10 to protect and support metal bumps 16. Lid $24_C$ adheres to device dies $12_I$, $12_{II}$, and $12_{III}$ via TIM $28_D$ and also adheres to stiffener ring 22'', placed at the edges between lid $24_D$ and package substrate 10, via adhesive layer 21. Stiffener ring 22'' supports lid $24_D$ and help form the space between lid $24_C$ and package substrate 10 to house device dies $12_I$, $12_{II}$, and $12_{III}$. Stiffener ring 22'' adheres to surface of package substrate 10 via adhesive layer 23. Adhesive layers 21 and 23 are made of silicone, in some embodiments. Stiffener ring 22 is made of copper with nickel coating or aluminum alloys, in some embodiments. Lid $24_D$ has flat portions $20_I$, $20_{II}$, and $20_{III}$ directly over top device $12_I$, $12_{II}$, and $12_{III}$, respectively. Each of the flat portions $20_I$, $20_{II}$, and $20_{III}$ of lid $24_D$ is similar to lid 24' of FIGS. 2A and 2B. The various lid designs with trenches 25 described above of lid 24' may also be used for flat portions $20_I$, $20_{II}$, and $20_{III}$ of lid $24_D$.

Figure 6A:
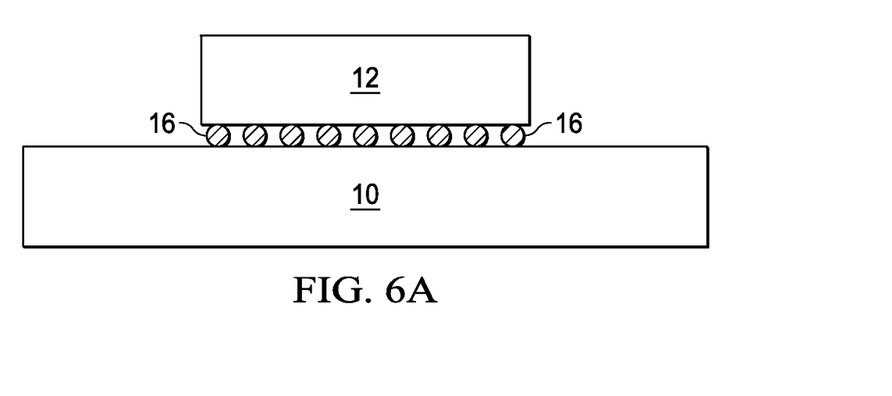
FIGS. 6A-6F are cross-sectional views of intermediate operations a sequential process of forming a package structure, in accordance with some embodiments.
Figure 6B:
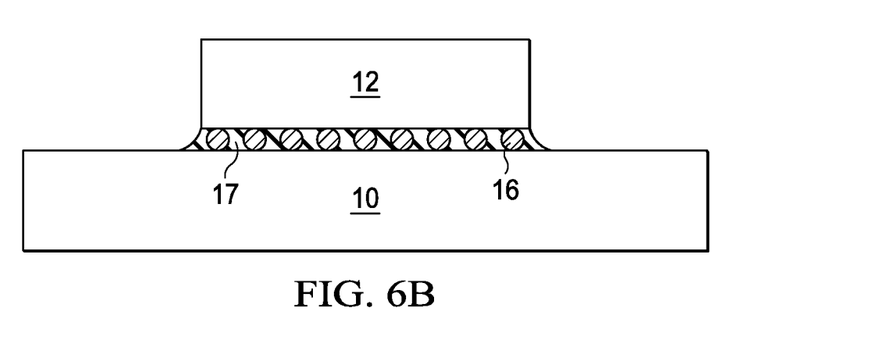
Figure 6C:
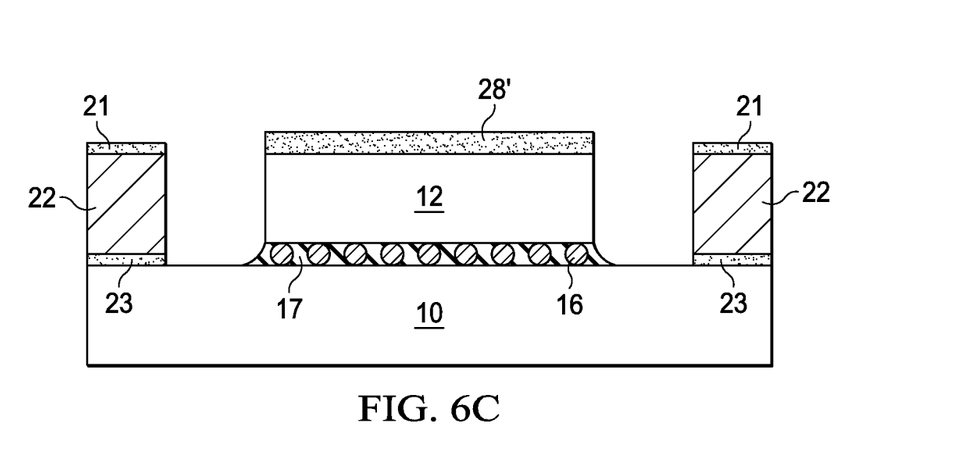
Figure 6D:
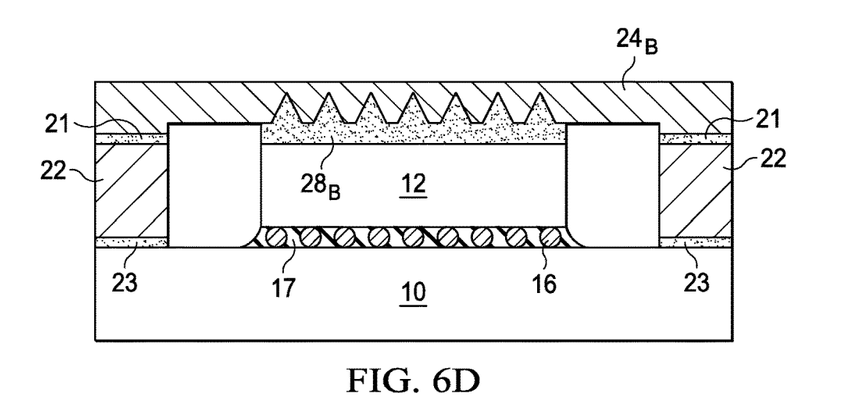
Figure 6E:
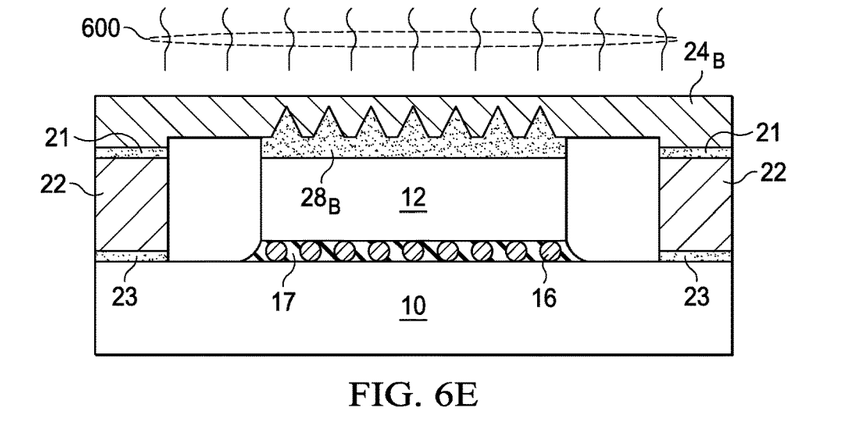

FIGS. 6A-6F are cross-sectional views of intermediate operations a sequential process of forming package structure 100, in accordance with some embodiments. Device die 12 (or in some embodiments, die stack 30) and package substrates 10 are formed separately first. Device die 12 is bonded to package substrate 10 via metal bumps 16, as shown in FIG. 6A. A reflow process is involved during the bonding process. Afterwards, underfill 17 is applied to fill the space between device die 12 and package substrate 10, as shown in FIG. 6B. Underfill 17 undergoes a curing process after it is applied. Afterwards, TIM $28_B$ is applied on the exposed surface (or back surface) of device die 12, and stiffener ring 22 is secured to package substrate 10 by adhesive layer 23, as shown in FIG. 6C. Lid $24_B$ is then placed over and secured to stiffener ring 22 by adhesive layer 21, as shown in FIG. 6D. Lid $24_B$ comes in contact with TIM $28_B$. The package substrate 10 with the elements described in FIG. 6D then undergoes a curing process 600, as shown in FIG. 6E. The curing process enables and enhances the adhesiveness of TIM $28_B$ with lid $24_B$ and device die 12. The curing process also enables and enhances the adhesiveness of adhesive layer 21 between lid $24_B$ and stiffener ring 22 and of adhesive layer 23 between stiffener ring 22 and package substrate 10. In some embodiments, the curing process is operated at a temperature in a range from about 100° C. to about 200° C. In some embodiments, the curing process is operated for a duration in a range from about 0.5 hour (hr) to about 3 hrs.

Figure 6F:
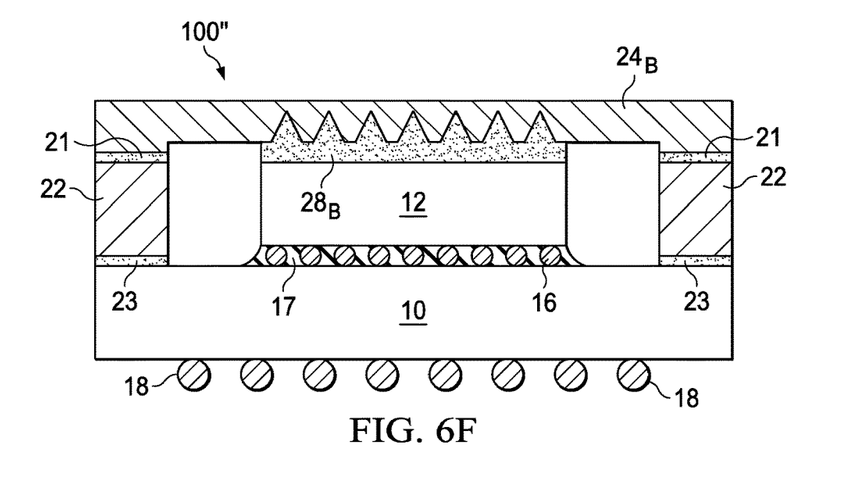

After the curing process of FIG. 6E, bumps 18 are formed on the side of package substrate opposite from the device die 12, as shown in FIG. 6F. FIG. 6F shows a package structure 100'', in accordance with some embodiments.

Embodiments of a lid covering a device die described above improve heat dissipation for a die package. Trenches are formed on the bottom side of a lid to increase surface area for heat dissipation. Various embodiments of the trenches on the lid are described. The layout and design of the trenches could be optimized to meet the heat dissipation need of the device die(s). By using the lid with trenches, heat dissipation efficiency is improved and the amount of thermal interface material (TIM) could be reduced. In addition, the selection of thermal interface materials for the lid is widened.

In some embodiments, a package structure is provided. The package structure includes a device die bonded to a package substrate, and a lid disposed over the device die. Trenches are formed on a surface of the lid facing the device die. The package structure also includes a thermal interface material (TIM) filing a space between the device die and the die, and the TIM fills the trenches formed on the surface of the lid.

In some other embodiments, a package structure is provided. The package structure includes a device die bonded to a package substrate, and a lid disposed over the device die. Trenches are formed on a surface of the lid facing the device die. The package structure also includes a thermal interface material (TIM) filing a space between the device die and the die, and the TIM fills the trenches formed on the surface of the lid. The package structure further includes a stiffener ring disposed over and adhered to edges of the package substrate, and edges of the lid are adhered to the stiffener ring.

In yet some other embodiments, a method of forming a package structure is provided. The method includes bonding a device die to a package substrate, and applying an underfill between the device die and the package substrate. The method also includes applying a thermal interface material (TIM) on a surface of the device die opposite the underfill. The method further includes placing a lid over the device die, and a surface region of the lid comes in contact with the TIM. The surface region of the lid has trenches.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package structure, comprising:
a device die bonded to a package substrate;
a lid comprising a first portion, a second portion, and a third portion, the first portion being disposed over the device die, wherein trenches are formed on a surface of the first portion of the lid facing the device die, the trenches having a star shape in a cross-sectional view, the trenches having a parallel bar shape in a top-down view, the second portion and the third portion of the lid being on opposite ends of the first portion, a bottommost surface of the second portion and a bottommost surface of the third portion being coplanar, the bottommost surfaces of the second portion and the third portion being lower than a bottommost surface of the first portion, an inner sidewall of the second portion and an inner sidewall of the third portion being perpendicular to the topmost major surface of the device die;
an adhesive material directly connecting the second portion and the third portion of the lid to a topmost surface of a stiffener ring, the stiffener ring surrounding the device die at edges of the package substrate, the topmost surface of the stiffener ring being coplanar with the topmost major surface of the device die, and sidewalls of the stiffener ring facing the device die being coterminous with the inner sidewall of the second portion and the inner sidewall of the third portion, respectively, wherein sidewalls of the stiffener ring facing away from the device die are coterminous with edges of the package substrate, and wherein the stiffener ring comprises copper with a nickel coating;
a thermal interface material (TIM) filling a space between the device die and the lid, wherein the TIM fills the trenches formed on the surface of the first portion of the lid; and
a fan bonded to the lid.

2. The package structure of claim 1, wherein at least one of the trenches has a depth being equal to or less than about half of a thickness of the lid.

3. The package structure of claim 1, wherein the trenches of the lid have an irregular pattern that is designed to substantially match the heat dissipation pattern of the device die.

4. The package structure of claim 1, wherein the package substrate has an interconnect structure connecting to a first plurality of bumps between the device die and a first surface of the package substrate and a second plurality of bumps on a second surface of the package substrate, wherein the second surface and the first surface are on opposite sides of the package substrate.

5. The package structure of claim 1, wherein the trenches are formed in a region of the surface of the first portion of the lid directly over the device die.

6. The package structure of claim 1, wherein a contact surface area between the TIM and the first portion of the lid is increased by the trenches in a range from about 2% to about 100% compared to a flat surface without the trenches.

7. The package structure of claim 1, wherein at least one of the trenches has a width in a range from about 0.1 mm to about 40 mm and a depth in a range from about 0.05 mm to about 2.5 mm.

8. The package structure of claim 1, wherein a thickness of the TIM between a bottom surface of the lid and a surface of the device die contacting the TIM is in a range from about 10 µm to about 300 µm.

9. The package structure of claim 1, further comprising an open space along sidewalls of the device die, the open space being between the sidewalls of the device die and sidewalls of the stiffener ring, and the inner sidewalls of the second portion and the third portion of the lid being exposed to the open space.

10. The package structure of claim 1, wherein the trenches extend diagonally in the top-down view with respect to side surfaces of the device die.

11. The package structure of claim 1, wherein the trenches comprise a first plurality of trenches extending in a first direction in the top-down view and a second plurality of trenches extending in a second direction in the top-down view, the second direction being perpendicular with the first direction.

12. A package structure, comprising:
a device die bonded to a package substrate;
a lid disposed over the device die, the lid comprising a central region and a peripheral region, a bottommost surface of the peripheral region being substantially level, and the bottommost surface of the peripheral region being lower than a bottommost surface of the central region, wherein a vertical sidewall connects the bottommost surface of the central region and the bottommost surface of the peripheral region, the lid having trenches on the bottommost surface of the central region of the lid facing the device die and directly overlying the device die, the trenches having a star shape in a cross-sectional view, the trenches being shaped in long parallel bars in a top-down view;
a thermal interface material (TIM) filling a space between the device die and the lid, and filling the trenches on the bottommost surface of the central region of the lid;
a stiffener ring disposed over and adhered to edges of the package substrate, the stiffener ring comprising nickel-coated copper, wherein the bottommost surface of the peripheral region of the lid is adhered to the stiffener ring, wherein internal sidewalls of the stiffener ring are coterminous with the vertical sidewall connecting the bottommost surface of the central region and the bottommost surface of the peripheral region, and wherein external sidewalls of the stiffener ring and an outer sidewall of the peripheral region are coterminus with an outer edge of the package substrate; and
at least one open space below the lid and surrounding the device die, the at least one open space laterally separating the device die from the stiffener ring, and the at least one open space exposing the vertical sidewall of the lid and an edge of the device die.

13. The package structure of claim 12, wherein the TIM comprises a polymer containing silicon, carbon, hydrogen, or oxygen.

14. The package structure of claim 12, further comprising an underfill filling a space between the device die and the package substrate.

15. The package structure of claim 12, wherein the bottommost surface of the peripheral region of the lid is higher than a topmost major surface of the device die.

16. The package structure of claim 12, wherein the at least one open space exposes an outer portion of the bottommost surface of the central region of the lid.

17. A package structure, comprising:
- a device die bonded to a package substrate;
- a thermal interface material (TIM) disposed over a surface of the device die facing away from the package substrate;
- a lid comprising a first portion having a first thickness, a second portion having a second thickness greater than the first thickness, and a third portion having the second thickness, the first portion being disposed over the TIM, the TIM filling trenches formed on a surface of the first portion of the lid facing the device die, wherein at least one of the trenches has a star shape in a cross-sectional view, wherein the at least one of the trenches has a parallel bar shape in a top-down view, and wherein the trenches are disposed only within all lateral extents of the device die;
- a stiffener ring disposed over the package substrate, the stiffener ring comprising copper having a nickel coating, the stiffener ring having a total width measured between an outer edge and an inner edge of the stiffener ring in a cross-sectional view, wherein a bottommost surface of the stiffener ring is lower than a bottommost major surface of the device die; and
- an adhesive layer directly connecting the second portion and the third portion of the lid to the stiffener ring, each of the second portion and the third portion of the lid having a width extending from an outer edge of the stiffener ring to an inner edge of the stiffener ring that is equal to the total width of the stiffener ring, and each of the second portion and the third portion having a substantially same thickness along an entirety of the width.

18. The package substrate of claim 17, wherein the TIM comprises alumina or zinc oxide mixed with silicone.

19. The package substrate of claim 17, wherein a lateral extent of the lid is greater than the lateral extent of the device die, and wherein the device die is disposed within the lateral extent of the lid.

20. The package structure of claim 17, wherein the first portion of the lid has a bottommost surface, and wherein the bottommost surface of the first portion of the lid is higher than a bottommost surface of the second portion and the third portion of the lid.

* * * * *